United States Patent
Chen et al.

(10) Patent No.: US 8,044,829 B2
(45) Date of Patent: Oct. 25, 2011

(54) MULTI-MODE ENCODING FOR DATA COMPRESSION

(75) Inventors: Liang-Chieh Chen, Milpitas, CA (US); Xueshi Yang, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 12/713,692

(22) Filed: Feb. 26, 2010

(65) Prior Publication Data

US 2010/0225506 A1    Sep. 9, 2010

Related U.S. Application Data

(60) Provisional application No. 61/157,589, filed on Mar. 5, 2009.

(51) Int. Cl.
*H03M 7/34* (2006.01)
*H03M 7/38* (2006.01)

(52) U.S. Cl. ............................ 341/51; 341/59; 341/87

(58) Field of Classification Search ................ 341/51, 341/59, 87
See application file for complete search history.

(56) References Cited

U.S. PATENT DOCUMENTS 4,988,998 A * 1/1991 O'Brien .................. 341/55
5,701,125 A * 12/1997 Berlin ..................... 341/63

* cited by examiner

*Primary Examiner* — Khai M Nguyen

(57) ABSTRACT

The present disclosure includes apparatus, systems and techniques relating to lossless data compression. In some implementations, an apparatus includes a memory module to store data. The memory module includes a first buffer portion to store encoded symbols of the data, and a second buffer portion to store symbols of the data to be encoded. The apparatus includes an encoder to compare the symbols stored in the second buffer portion with the encoded symbols stored in the first buffer portion and to compress the data. The encoder can operate in a first encoding mode to encode the symbols in the second buffer portion with corresponding codewords until detecting a repeated pattern of symbols in the second buffer portion that matches the encoded symbols in the first buffer portion. The encoder can operate in a second encoding mode responsive to detecting the repeated pattern.

20 Claims, 15 Drawing Sheets

US 8,044,829 B2

MULTI-MODE ENCODING FOR DATA COMPRESSION

CROSS REFERENCE TO RELATED APPLICATIONS

This application claims the benefit of the priority of U.S. Provisional Application Ser. No. 61/157,589, filed Mar. 5, 2009 and entitled "EFFICIENT LEMPEL-ZIV COMPRESSION WITH RUN LENGTH ENCODING," the disclosure of which is incorporated by reference herein in its entirety.

BACKGROUND

The present disclosure describes systems, apparatus and techniques relating to data compression technology.

Lossless data compression is a type of data compression that preserves the original data during the compression process. Thus, decompressing or decoding compressed data encoded using a lossless data compression algorithm allows reconstruction of the original data. This is different from lossy data compression, which approximates the original data and causes some loss of data. Lossless data compression is used when deviation from the original data can be critical for a particular application. Conventional lossless data compression algorithms often generate a statistical model for input data, and use the generated model to map the input data to bit sequences so as to have the repeated data generate a shorter output than non-repeated data.

SUMMARY

The present disclosure includes apparatus, systems and techniques relating to efficient lossless data compression. An encoder can be configured to switch between two encoding modes to enhance data compression. According to an aspect of the described systems and techniques, an apparatus includes a memory module to store data. The memory module includes a first buffer portion to store encoded symbols of the data, and a second buffer portion to store symbols of data to be encoded. The apparatus includes an encoder to compare the symbols stored in the second buffer portion with the encoded symbols stored in the first buffer portion and to compress the data. The encoder is configured to operate in a first encoding mode to encode the symbols in the second buffer portion with corresponding codewords until the encoder detects a repeated pattern of symbols in the second buffer portion that matches the encoded symbols in the first buffer portion. Additionally, the encoder is configured to switch to operate in a second encoding mode responsive to the encoder detecting the repeated pattern of symbols. During the second encoding mode, the encoder counts a number of times the pattern of symbols repeats in the second buffer portion, and outputs the number counted. Also, the encoder is configured to switch back to the first encoding mode when the encoder detects that the symbols in the second buffer stop repeating.

Implementations can optionally include one or more of the following features. The first encoding mode can include a Lempel-Ziv encoding mode. The Lempel-Ziv encoding mode can include a Lempel-Ziv-Storer-Szymanski (LZSS) encoding mode. The second encoding mode can include a run-length encoding (RLE) mode. The encoder can be configured to output an escape code responsive to the encoder detecting the repeated pattern of symbols, with the escape code including a single occurrence of a codeword. The escape code can include a flag to indicate whether next data in the escape code is a literal or an offset-length pair; an offset to represent a location of a match in the first buffer portion of the repeated pattern of symbols in the second buffer portion; and a length to represent a size of the second buffer portion. The escape code can include two consecutive occurrences of the codeword. The encoder can be configured to update the first buffer portion with codewords generated during the first encoding mode. Also, the encoder can be configured to update the first buffer portion once during the second encoding mode. The encoder can be configured to count the number of times the pattern of symbols repeats in the second buffer starting with a first occurrence of the pattern after outputting the escape code.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiments below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, a system can include a data processing device to encode data to generate compressed data. The data processing device can include a data buffer to receive the input data. The data buffer can include a search buffer to buffer encoded symbols of the input data, and a look-ahead buffer to buffer symbols of the input data to be encoded. The data processing device can include an encoder to compare the symbols buffered in the look-ahead buffer with the encoded symbols buffered in the search buffer and to compress the input data. The encoder is configured to operate in a first encoding mode to encode the symbols in the look-ahead buffer with corresponding codewords until the encoder detects a repeated pattern of symbols in the look-ahead buffer that matches the encoded symbols in the search buffer. Responsive to detecting the repeated pattern of symbols, the encoder switches to operate in a second encoding mode to count a number of times the pattern of symbols repeats in the look-ahead buffer, and output the number counted. The encoder is configured to switch back to the first encoding mode when the encoder detects that the symbols in the second buffer stop repeating.

Implementations can optionally include one or more of the following features. The first encoding mode can include a Lempel-Ziv encoding mode. The Lempel-Ziv encoding mode can include a Lempel-Ziv-Storer-Szymanski (LZSS) encoding mode. The second encoding mode can include a run-length encoding (RLE) mode. The encoder can be configured to output an escape code responsive to the encoder detecting the repeated pattern of symbols. The escape code can include a single occurrence of a codeword. The escape code can include a flag to indicate whether next data in the escape code is a literal or an offset-length pair; an offset to represent a location of a match in the search buffer of the repeated pattern of symbols in a location of a match in the first buffer of a size of the search buffer minus a length of the pattern of symbols that repeats in the look-ahead buffer; and a length to represent a size of the look-ahead buffer. The escape code can include two consecutive occurrences of the codeword. The encoder can be configured to update the search buffer with each codeword generated during the first encoding mode; update the search buffer once during the second encoding mode; and count the number of times the pattern of symbols repeats in the second buffer starting with a first occurrence of the pattern after outputting the escape code.

According to another aspect of the described systems and techniques, a method performed by a data processing device can include one or more of the following features. The method performed by a data processing device includes storing data in a memory module. Storing the data includes storing encoded symbols of the data in a first buffer portion of the memory module, and storing symbols of the data to be encoded in a second buffer portion of the memory module. The method includes compressing the data. Compressing the data includes comparing the symbols stored in the second buffer portion with the encoded symbols stored in the first buffer portion. Compressing the data includes operating an encoder in a first encoding mode to encode the symbols in the second buffer portion with corresponding codewords until detecting a repeated pattern of symbols in the second buffer portion that matches the encoded symbols in the first buffer portion. Responsive to detecting the repeated pattern of symbols, an encoder operates in a second encoding mode. Operating in the second encoding mode includes counting a number of times the pattern of symbols repeats in the second buffer portion, and outputting the number counted. Additionally, the method includes switching back to the first encoding mode when detecting that the symbols in the second buffer stop repeating.

Implementations can optionally include one or more of the following features. The first encoding mode can include a Lempel-Ziv encoding mode. The Lempel-Ziv encoding mode can include a Lempel-Ziv-Storer-Szymanski (LZSS) encoding mode. The second encoding mode can include a run-length encoding (RLE) mode. The method can include outputting an escape code responsive to detecting the repeated pattern of symbols. The escape code can include a single occurrence of a codeword. The escape code can include: a flag to indicate whether next data in the escape code is a literal or an offset-length pair; an offset to represent a location of a match in the first buffer portion of the repeated pattern of symbols in the second buffer portion; and a length to represent a size of the second buffer portion. The escape code can include two consecutive occurrences of the codeword. The method can include updating the first buffer portion with each codeword generated during the first encoding mode; and updating the first buffer portion once during the second encoding mode. The method can include counting the number of times the pattern of symbols repeats in the second buffer starting with a first occurrence of the pattern after outputting the escape code.

The described apparatus, systems and techniques can result in one or more of the following advantages. An improved lossless compression process can be implemented to combine the advantages of Lempel-Ziv encoding and run-length encoding. An encoder can be configured to switch between two encoding modes, e.g., a Lempel-Ziv encoding mode and a run-length encoding mode. During a first encoding mode, the encoder can operate in the Lempel-Ziv mode to encode non-repeating symbols using least number of bits as possible. For example, the first encoding mode can include a Lempel-Ziv-Storer-Szymanski (LZSS) encoding mode to encode non-repeating symbols using a codeword that includes a flag bit and a literal. When a repeated pattern of symbols are detected, the encoder can switch to operate in a second encoding mode to count a number of times the pattern repeats. The encoder can delay updating the buffer until the pattern stops repeating and the counted number is obtained.

Details of one or more implementations are set forth in the accompanying drawings and the description below. Other features, objects and advantages may be apparent from the description and drawings, and from the claims.

DRAWING DESCRIPTIONS

Like reference symbols in the various drawings indicate like elements.

DETAILED DESCRIPTION

The systems, apparatus and techniques described herein can be implemented as one or more devices, such as one or more integrated circuit (IC) devices (e.g., data communication devices, such as network appliances; computing devices, such as a computer, a server, a laptop, and a smart phone; and networked data storage devices, such as a disk storage device, a tape storage drive, etc.). For example, the systems and techniques described in this specification can be implemented to perform efficient lossless data compression that reduces a critical path associated with buffer updates.

Figure 1:
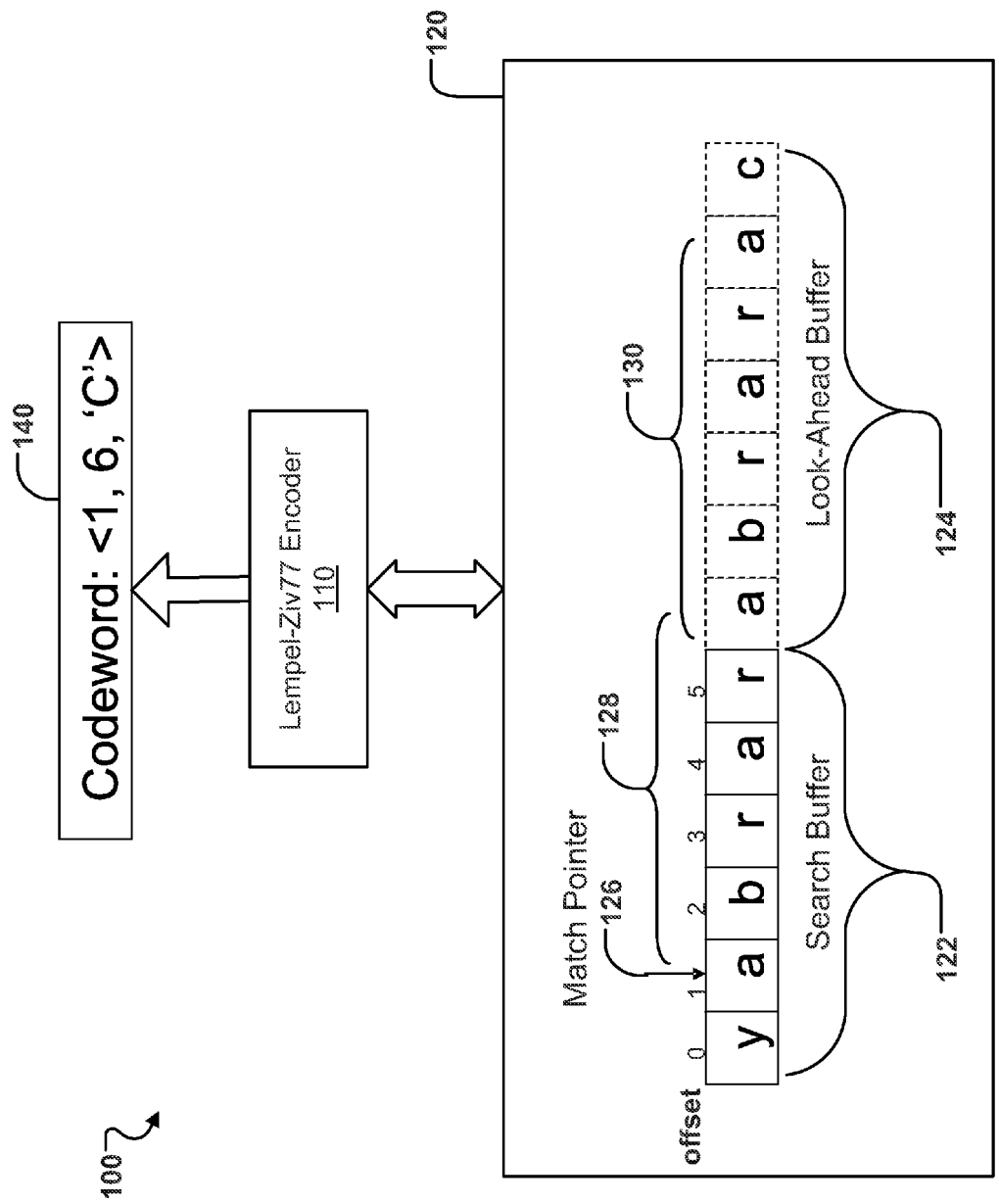
FIG. 1 is a block diagram of an example apparatus for performing Lempel-Ziv77 (LZ77) encoding.

FIG. 1 is a block diagram of an example apparatus for performing Lempel-Ziv77 (LZ77) encoding. LZ77 encoding is a lossless data compression technique. The apparatus 100 includes a LZ77 encoder 110 that communicates with a memory module, such as a buffer 120. The buffer 120 can include two structures, a search buffer 122 and a look-ahead buffer 124. The search buffer 122 can store the encoded symbols of desired data, and the look-ahead buffer 124 can store the incoming symbols of the data to be encoded. The search buffer 122 and the look-ahead buffer 124 can be implemented as separate buffers or as a single buffer with multiple portions.

The LZ77 encoder 110 can compare the symbols in the look-ahead buffer 124 124 with the encoded symbols in the search buffer 122 to identify a pattern of symbols 130 with the longest match. The LZ77 encoder 110 can encode the identified pattern of symbols with a codeword 140. In the example shown in FIG. 1, the pattern of symbols "a b r a r a" 130 in the look-ahead buffer 124 is identified to match the encoded symbols "a b r a r a" 128 in the search buffer 122. The matched pattern of encoded symbols in the search buffer 122 can extend into the look-ahead buffer 124.

The LZ77 encoder 110 can generate the codeword 140 to include three elements as follows: <offset, length, char>. A match pointer 126 points to the starting position of the matched pattern of encoded symbols 128. The offset bit represents a distance of the match pointer 126 (e.g., the beginning of the pattern) from the first symbol in the search buffer 122. The length bit represents a length of the matched pattern of encoded symbols 128 in the search buffer 122. As described above, the length can extend inside the look-ahead buffer 124. The char byte represents the next un-matched character or symbol in the look-ahead buffer 124. Thus, the matched pattern of symbols "a b r a r a c" can be encoded with a codeword <1, 6, 'c'>. The offset bit of '1' indicates that the beginning of the pattern is 1 byte away from the first symbol in the search buffer 122. The length byte of '6' indicates that the length of the matched pattern is 6 symbols. The char byte of 'c' indicates that the next unmatched symbol is 'c.'

Figure 2:
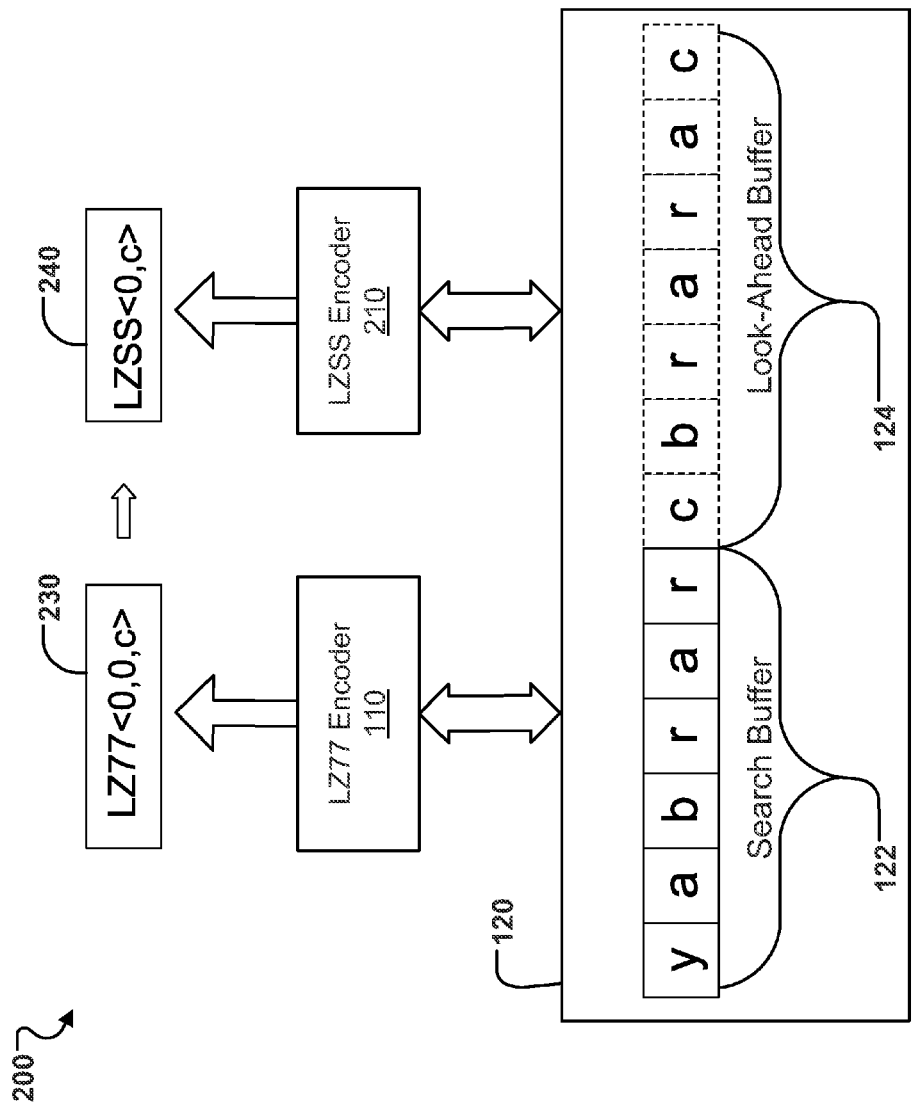
FIG. 2 is a block diagram that compares LZ77 encoding and Lempel-Ziv-Storer-Szymanski (LZSS) encoding.

FIG. 2 is a block diagram 200 that compares LZ77 encoding and Lempel-Ziv-Storer-Szymanski (LZSS) encoding. LZSS encoding is a variant of the LZ77 encoding. LZSS encoding can eliminate a situation where a triple element codeword is used to encode a single character or symbol. For example, the symbol 'c' does not appear in the search buffer 122 of the buffer 120. An LZ77 encoder 110 can encode the symbol 'c' with a codeword <0,0,'c'> 230, which uses more than 8 bits.

Compared to the triple element codeword used by the LZ77 encoder 110, an LZSS encoder 210 can encode the same symbol 'c,' with a two element codeword <0, c> 240. The first element of the LZSS codeword 240 is a one-bit flag used to indicate whether the next chunk of data is a literal (e.g., byte) or an offset-length pair. The second element of the LZSS codeword 240 is either a literal (e.g., byte) or an offset-length pair depending on the value of the one-bit flag. For example, when the LZSS encoder does not find a match for the current symbol (e.g., 'c') in the search buffer 122, the LZSS encoder 210 outputs an LZSS codeword that includes the elements <0, char>. The zero flag bit indicates that a match was not found. Then the second element is a literal (e.g., byte), which in this case is the symbol 'c'. The encoded LZSS codeword <0, c> is 9-bit long.

When the LZSS encoder 210 identifies a match for the current symbol in the search buffer 122, the LZSS encoder 210 outputs an LZSS codeword that includes the elements <1, offset, length>. The flag bit value of '1' indicates that a pattern of symbols in the look-ahead buffer 124 was matched with the same pattern of encoded symbols in the search buffer 122. The element 'length' represents the length of the matched pattern of symbols, and the element 'offset' represents the starting position of the pattern of symbols matched in the search buffer 122.

Figure 3:
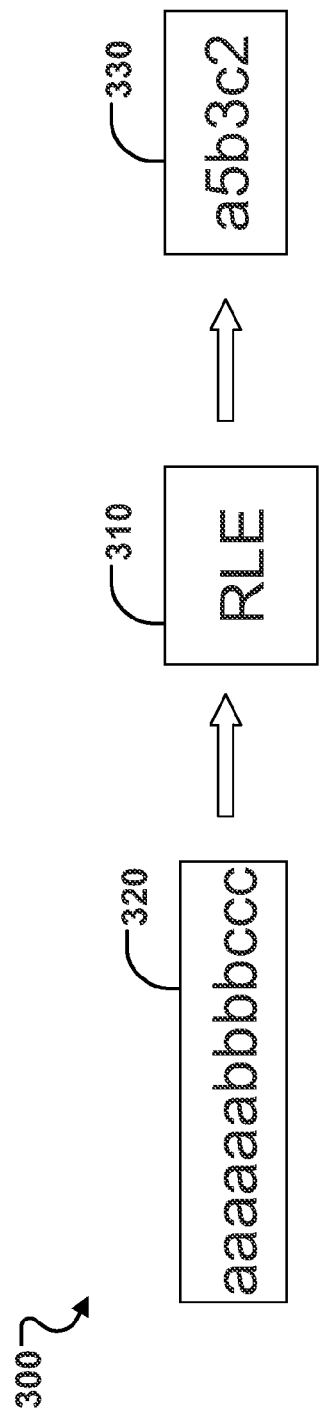
FIG. 3 is a block diagram that shows an example apparatus for performing run-length encoding.

FIG. 3 is a block diagram that shows an example apparatus for performing run-length encoding (RLE). RLE is another form of lossless data compression. The apparatus 300 includes a run-length encoder (RLE) 310 that communicates with a buffer 320 to encode the symbols stored in the buffer 320. The RLE 310 can replace a string or pattern of repeating symbols with an RLE codeword 330 that includes a single symbol or pattern and a count (e.g., run length). A pattern could be m-byte long, where m≧1. The count indicates the number of times the pattern of symbols is repeated (not to be confused with a total number of the symbols). For example, FIG. 3 shows the buffer 320 that stores a run of symbol 'a' that repeats five times after the initial occurrence, a run of symbol 'b' that repeats three times after the initial occurrence, and a run of symbol 'c' that repeats twice after the initial occurrence. The RLE 310 can encode the run of symbols as <a5b3c2>.

Additionally, the RLE 310 can detect various repeated patterns of symbols. For example, when an input stream of data includes 'a b a b a b a b b b b b c b c', the RLE 310 can encode these symbols as <ab3b4cbc>. Also, the input stream can be encoded using other RLE encoding interpretations.

Figure 4:
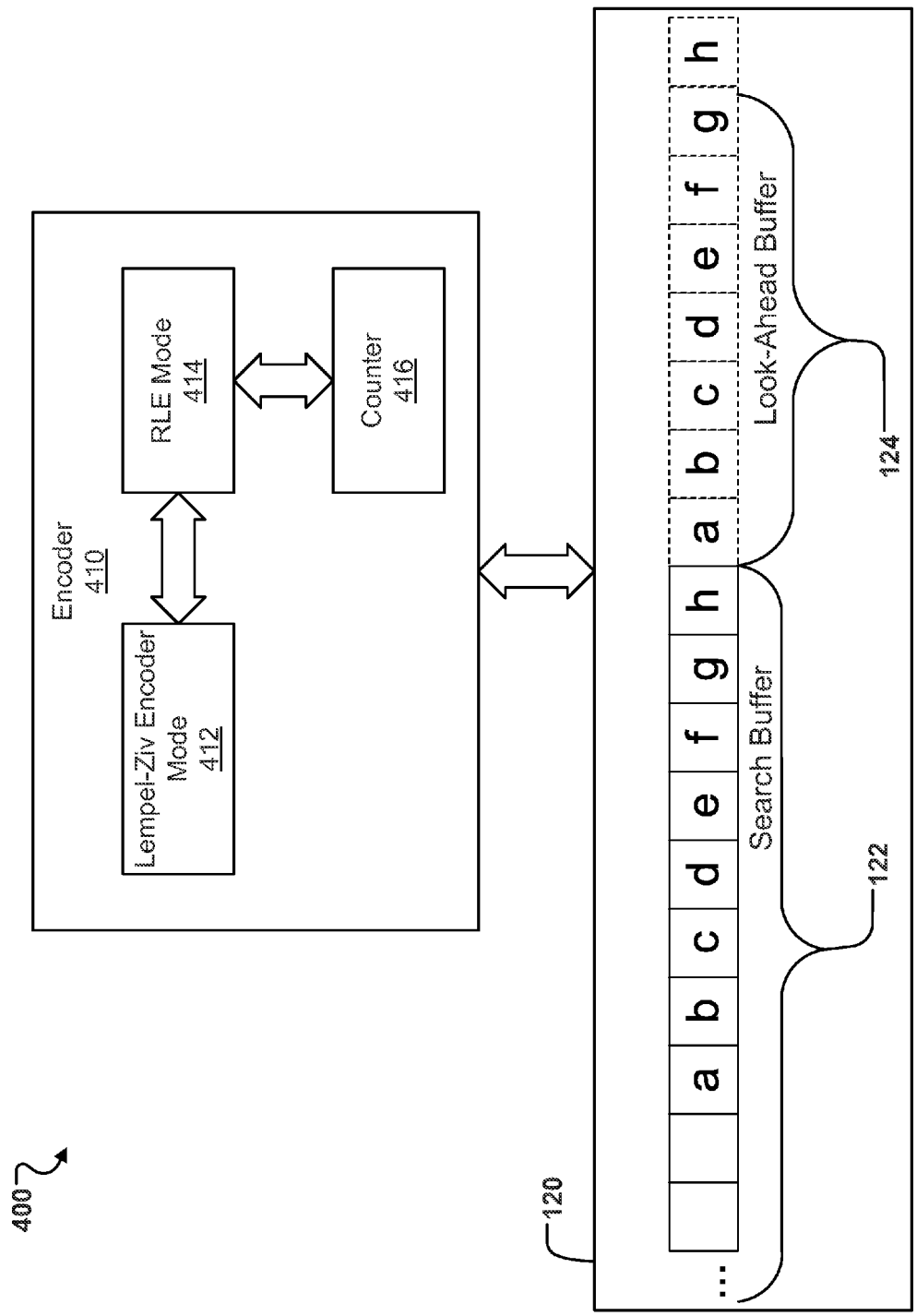
FIG. 4 is a block diagram of an example apparatus for performing Lempel-Ziv compression with run-length encoding.

FIG. 4 is a block diagram of an example apparatus for performing Lempel-Ziv compression with run-length encoding. The apparatus 400 includes a memory module, such as a buffer 120 that communicates with an encoder 410. The buffer 120 includes a search buffer 122 to store the encoded symbols of input data, and a look-ahead buffer 124 to store the incoming stream of symbols of the data to be encoded. The encoder 410 can include a Lempel-Ziv encoding mode unit 412, an RLE mode unit 414 and a counter 416.

The encoder 410 can operate in two different encoding modes by switching between the Lempel-Ziv encoding mode unit 412 and the RLE mode unit 414 during operation. The Lempel-Ziv encoding mode unit 412 can implement any of the LZ encoding modes, such as the LZSS encoding mode. For example, the encoder 410 can initially operate to use the LZSS encoding mode unit 412 to encode the symbols in the look-ahead buffer 124 that do not match the encoded symbols in the search buffer 122. By using the LZSS encoding mode unit 412, the encoder 410 can encode the non-matching symbols using a two element codeword rather than a three element codeword used by a LZ77 encoder.

When the encoder 410 identifies a pattern of symbols in the look-ahead buffer 124 that matches the encoded symbols in the search buffer 122, the encoder 410 can output an escape code and switch to the RLE mode unit 414. When using the RLE mode unit 414, the counter 416 can be used to count the number of times the pattern of symbols repeats in the look-ahead buffer 124. The counter 416 can count the number of times the pattern of symbols repeats starting with the first occurrence of the pattern of symbols after the escape code is outputted. When the run of repeated pattern of symbols ends, the encoder 410 can switch back to the LZSS encoding mode unit 412 to encode the non-matching symbols.

In memory-type data files, such as binary executable files and computer generated files, such as an object file, database files, etc., the run of zeros can appear frequently. By combining an RLE mode and an LZSS encoding mode, further compression can be achieved than possible with either encoding schemes alone.

The escape code that indicates the switch from using the Lempel-Ziv encoding mode unit 412 to the RLE mode unit 414 can be implemented using different types of escape codes. For example, a customized codeword that includes the following elements can be used: <flag, offset, length>. The flag, offset and length elements can be similar to those described with respect to LZ77 and LZSS above.

However, certain constraints can be applied to the three elements of the codeword. For example, the length element can be equal to the look-ahead buffer size. Additionally, the offset element can be greater than or equal to a value of the search buffer size minus the look-ahead buffer size.

When the search buffer size is 128 bytes, and the look-ahead buffer size is 8 bytes, for example, the following codewords can be used as an escape code:

<1,120,8> to represent one periodic pattern of 8 bytes in the look-ahead buffer (see FIG. 5 below);

<1,121,8> to represent one periodic pattern of 7 bytes in the look-ahead buffer (see FIG. 9 below);

<1,122,8> to represent one periodic pattern of 6 bytes in the look-ahead buffer;

<1,123,8> to represent one periodic pattern of 5 bytes in the look-ahead buffer;

<1,124,8> to represent two identical patterns of 4 bytes in the look-ahead buffer (see FIG. 6 below);

<1,125,8> to represent two periodic patterns of 3 bytes in the look-ahead buffer;

<1,126,8> to represent four identical patterns of 2 bytes in the look-ahead buffer (see FIG. 7 below); and <1,127,8> to represent 8 identical patterns of 1 byte in the look-ahead buffer (see FIG. 8 below).

Figure 5:
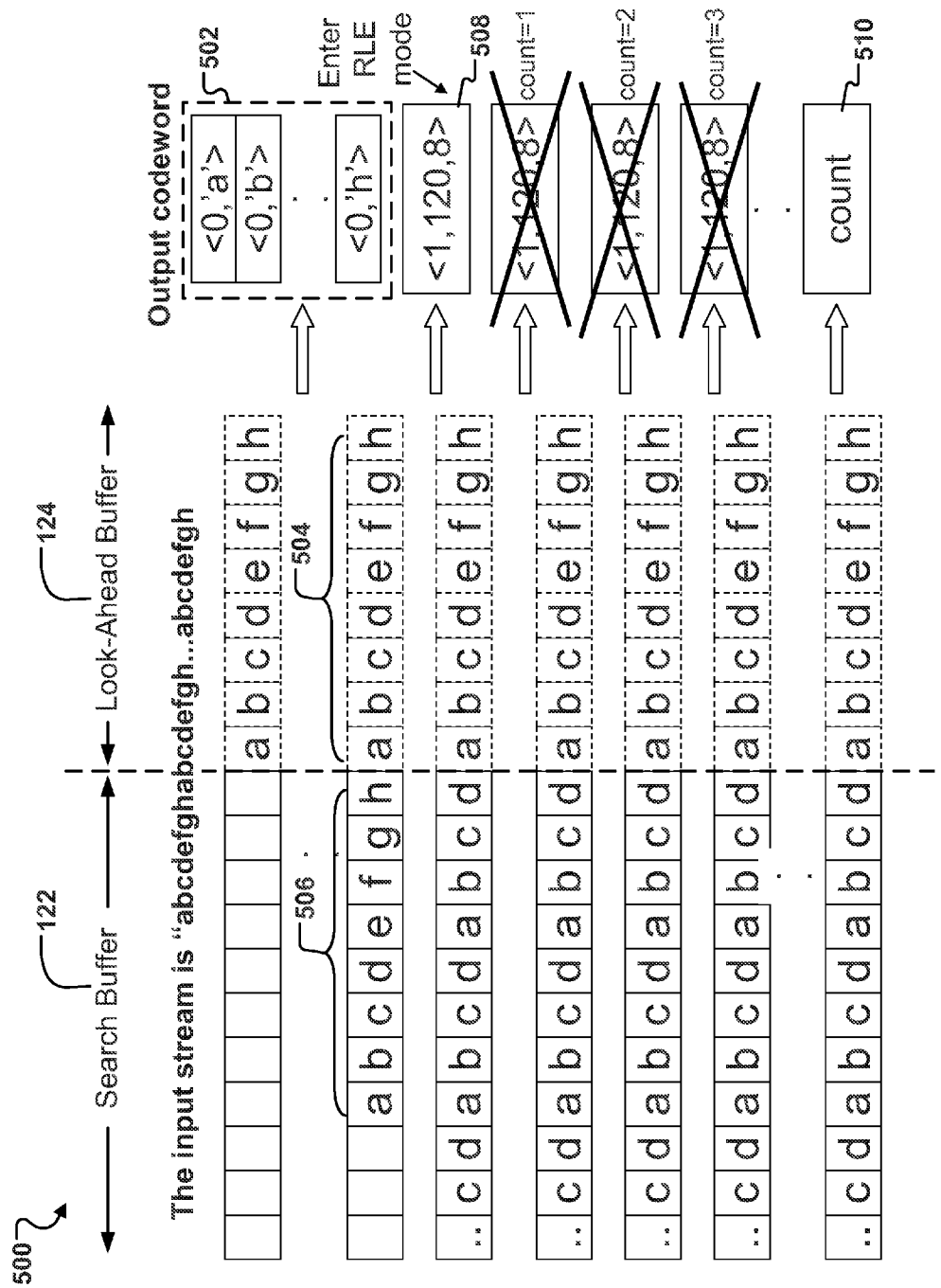
FIG. 5 is a block diagram showing an example encoding process using a codeword as an escape code.

FIG. 5 is a block diagram showing an example encoding process 500 using one occurrence of a codeword as an escape code. In this encoding example 500, an escape code of <1,120,8> is used to represent one periodic pattern of 8 bytes (a, b, c, d, e, f, g, h) in the look-ahead buffer 124. The search buffer size is 128 bytes, and the look-ahead buffer size is 8 byes. Initially, the encoder (e.g., encoder 410) operates by using the LZSS encoding mode unit 412.

The encoder compares the first symbol 'a' in the look-ahead buffer 124 with the encoded symbols in the search buffer 122 and finds no match. Because a match was not found for 'a,' the encoder outputs a corresponding codeword 502 (e.g., <0, 'a'>). The flag bit of '0' indicates that a match was not found and that the next data is a literal (byte). The encoder continues to encode the following input stream of symbols 'b,' 'c,' 'd,' 'e,' 'f,' 'g' and 'h' with corresponding codewords 502 (e.g., <0, 'b'>, <0, 'c'>, <0, 'd'>, <0, 'e'>, <0, 'f'>, <0, 'g'> and <0, 'h'>) to indicate that a match was not found for these symbols. After encoding each symbol using the LZSS encoding mode unit 412, the encoder shifts or updates the search buffer 122 with the corresponding encoded symbol.

After encoding the symbols 'a,' 'b,' 'c,' 'd,' 'e,' 'f,' 'g' and 'h,' the encoder identifies a pattern of symbols 504 ('a,' 'b,' 'c,' 'd,' 'e,' 'f,' 'g' and 'h') in the look-ahead buffer 124 that match the encoded symbols 506 ('a,' 'b,' 'c,' 'd,' 'e,' 'f,' 'g' and 'h') in the search buffer 122. The encoder encodes the identified pattern of symbols and outputs an escape code (e.g., <1, 120, 8>) 508. The escape code indicates that the encoder is switching to use the RLE mode unit 414.

During the RLE mode, the encoder identifies and counts a number of times the pattern of symbols repeats in the look-ahead buffer 124. The encoder can include a counter to count the number of repeats. The encoder starts the count from the first occurrence of the pattern of symbols after outputting the escape code. Additionally, rather than outputting a codeword, the encoder simply counts the number of repeats. The cross-outs of the codewords indicate that the encoder is simply counting the number of times the pattern of symbols repeats rather than outputting a codeword. When the encoder detects that the pattern of symbols stops repeating, the encoder outputs the final count total 510 and switches back to using the LZSS encoding mode unit 412.

Figure 6:
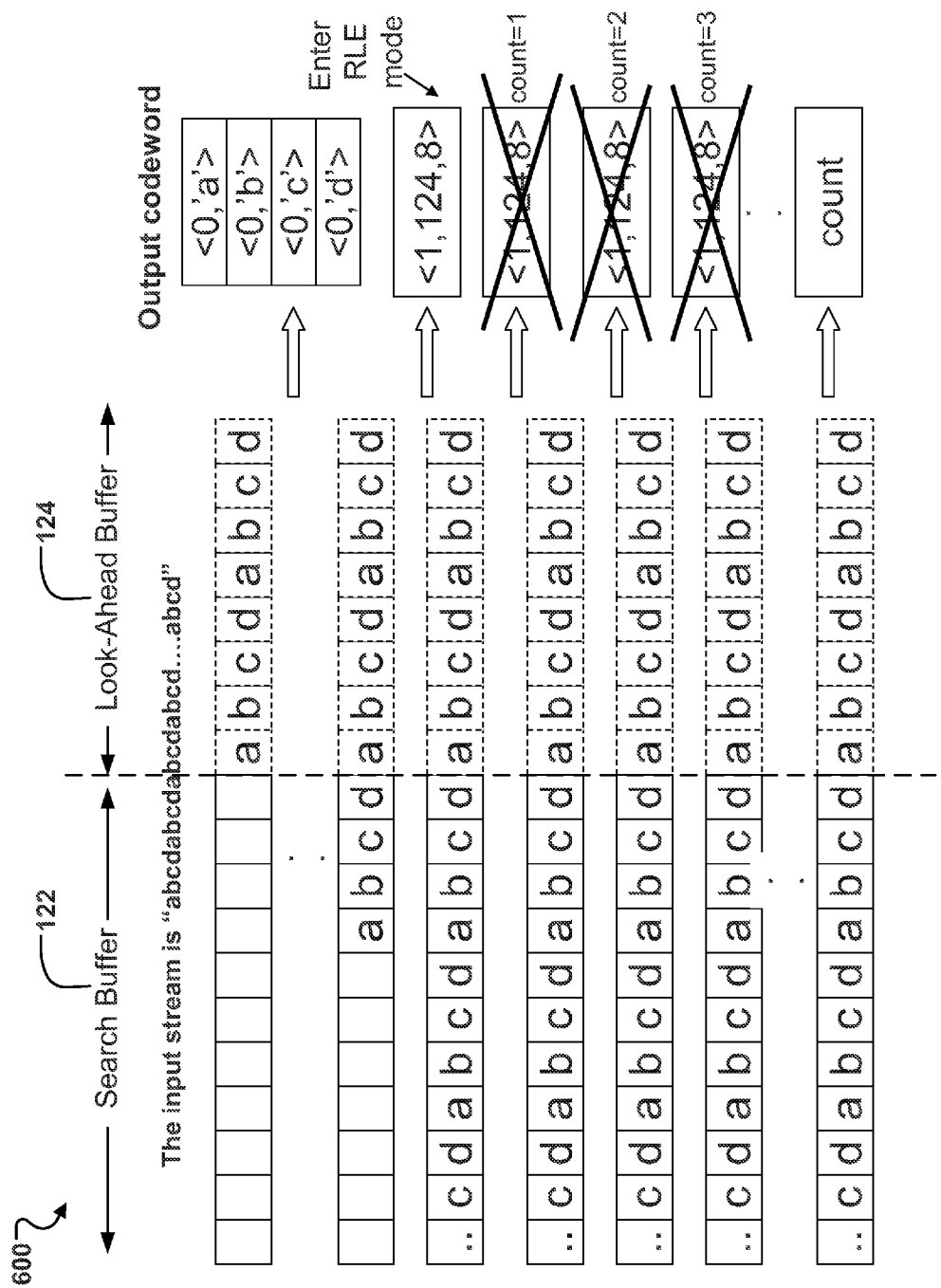
FIG. 6 is a block diagram showing another example encoding process using a codeword as an escape code.
Figure 7:
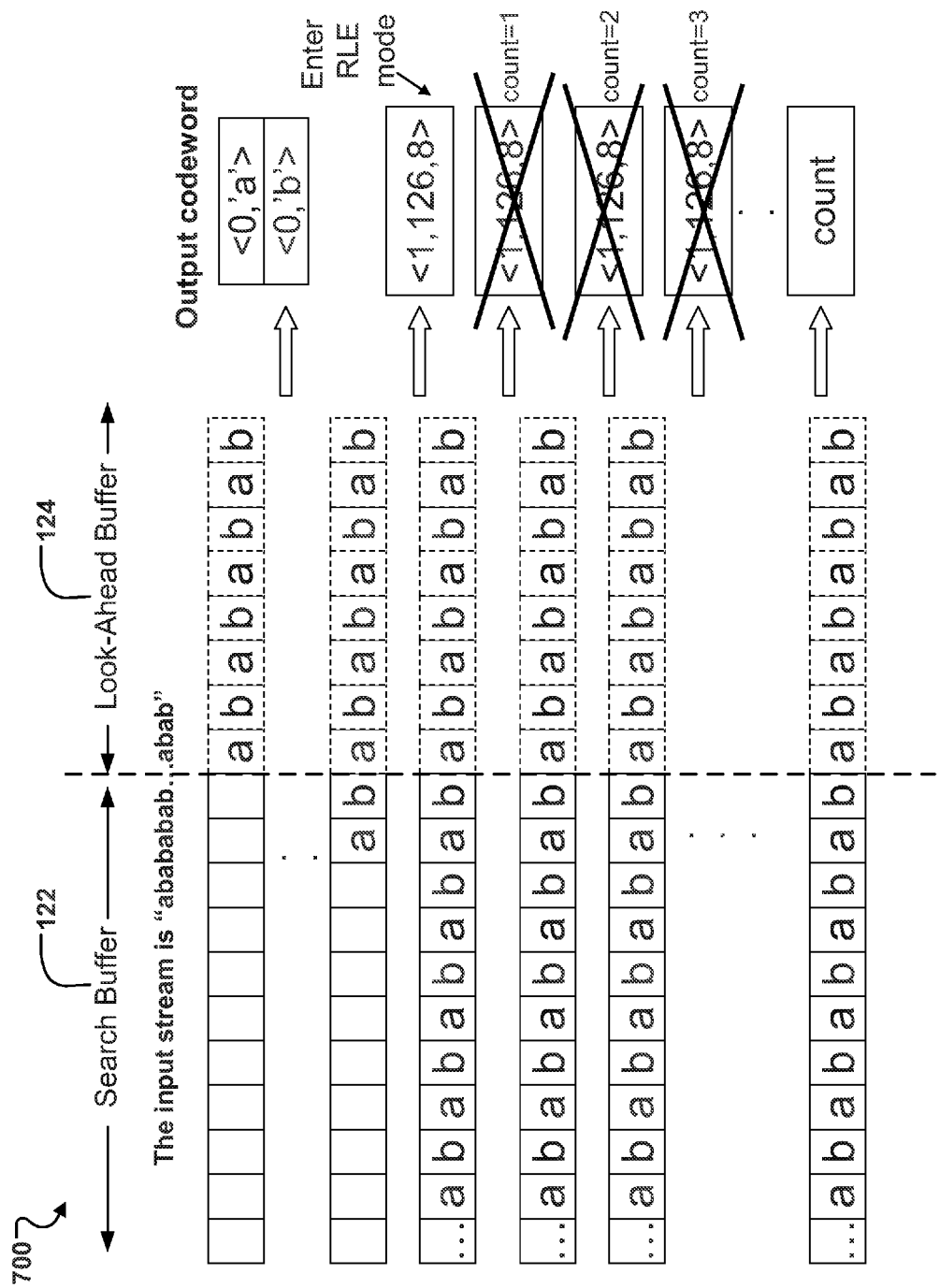
FIG. 7 is a block diagram showing a third example encoding process using a codeword as an escape code.
Figure 8:
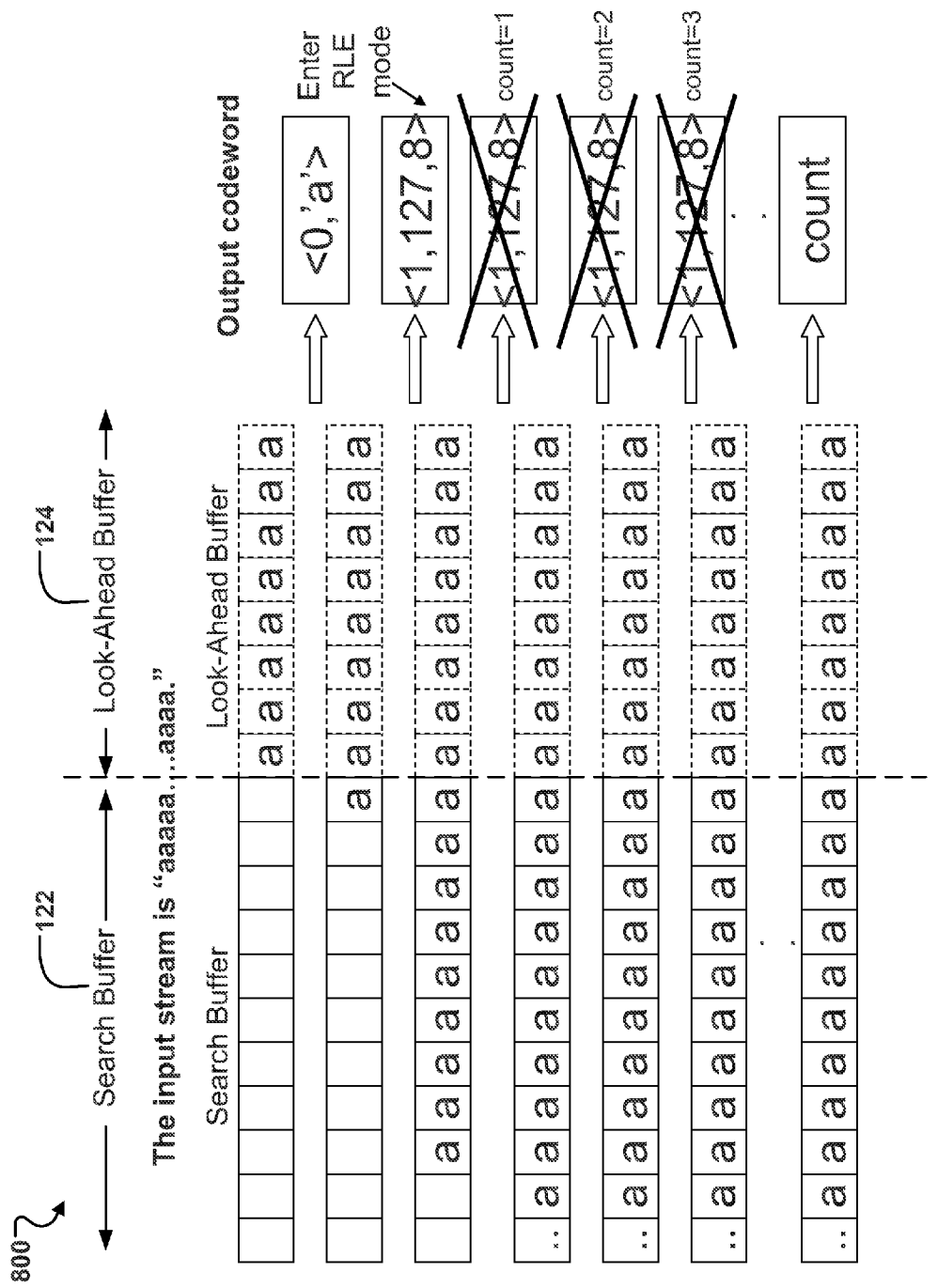
FIG. 8 is a block diagram showing a fourth example encoding process using a codeword as an escape code.

Three additional examples of using an escape code are described with respect to FIGS. 6, 7 and 8. In these examples, the encoder switches between using the LZSS encoding mode unit 412 and the RLE mode unit 414 based on an output of an escape code as described with respect to FIG. 5 above.

FIG. 6 is a block diagram showing another example encoding process 600 using one occurrence of a codeword as an escape code. Similar to FIG. 5 above, the encoder compares the input stream of symbols in the look-ahead buffer 124 with the encoded symbols in the search buffer 122. In this encoding example 600, an escape code of <1,124,8> is used to represent two identical patterns of 4 bytes (a, b, c, d) in the look-ahead buffer 124. The encoder outputs the escape code to indicate that the encoder is switching from the LZSS encoding mode unit 412 to the RLE mode unit 414. The cross-outs of the codewords indicate that the encoder is simply counting the number of times the pattern of symbols repeats rather than outputting a codeword. When detecting that the pattern of symbols stops repeating, the encoder switches back to use the LZSS encoding mode unit 412. The search buffer size is 128 bytes, and the look-ahead buffer size is 8 byes.

FIG. 7 is a block diagram showing a third example encoding process 700 using one occurrence of a codeword as an escape code. Similar to FIG. 5 above, the encoder compares the input stream of symbols in the look-ahead buffer 124 with the encoded symbols in the search buffer 122. In this encoding example 700, an escape code of <1,126,8> is used to represent four identical patterns of 2 bytes (a, b) in the look-ahead buffer 124. The encoder outputs the escape code to indicate that the encoder is switching from the LZSS encoding mode unit 412 to the RLE mode unit 414. The cross-outs of the codewords indicate that the encoder is simply counting the number of times the pattern of symbols repeats rather than outputting a codeword. When detecting that the pattern of symbols stops repeating, the encoder switches back to use the LZSS encoding mode unit 412. The search buffer size is 128 bytes, and the look-ahead buffer size is 8 byes.

FIG. 8 is a block diagram showing a fourth example encoding process 800 using one occurrence of a codeword as an escape code. Similar to FIG. 5 above, the encoder compares the input stream of symbols in the look-ahead buffer 124 with the encoded symbols in the search buffer 122. In this encoding example 800, an escape code of <1,127,8> is used to represent 8 identical patterns of 1 byte (a) in the look-ahead buffer 124. The encoder outputs the escape code and indicates that the encoder is switching from the LZSS encoding mode unit 412 to the RLE mode unit 414. The cross-outs of the codewords indicate that the encoder is simply counting the number of times the pattern of symbols repeats rather than outputting a codeword. When detecting that the pattern of symbols stops repeating, the encoder switches back to use the LZSS encoding mode unit 412. The search buffer size is 128 bytes, and the look-ahead buffer size is 8 byes.

Additionally, the encoder can use two consecutive output of a codeword as the escape code that indicates that the encoder is switching to use the RLE mode unit 412. Using different types of the escape code can have different advantages. For example, using a single occurrence of a codeword as the escape code can switch the encoder 410 to use the RLE mode unit 414 one codeword earlier than using a repeated occurrence of the codeword. As shown in FIGS. 5-8, the encoder switches to use the RLE mode unit 414 after outputting the escape code that includes a single codeword. When using the LZSS encoding mode unit 412, the encoder needs to update the search buffer after each encoding. However, when using the RLE mode unit 414, the encoder can delay updating the search buffer until the count of the total number of times the pattern of symbols repeats has been determined. Thus, sooner the encoder can use the RLE mode unit 414, sooner the encoder can delay updating the search buffer.

In comparison, when using a repeated occurrence of a codeword as an escape code, the encoder does not switch to use the RLE mode unit 414 until outputting at least two consecutive codewords. This can delay the switch to use the RLE mode unit 414 by one codeword. However, if the identified pattern of symbols does not repeat after outputting the codeword once, the encoder may unnecessarily use extra bits to encode the count. Using the repeated occurrence of a codeword (e.g., two consecutive occurrences of a codeword) as an escape code can prevent the encoder from unnecessarily using extra bits to encode the count when the count is zero. A comparison of data compression efficiency between using one codeword and two codewords as the escape code is described with respect to FIG. 11 below.

Figure 9:
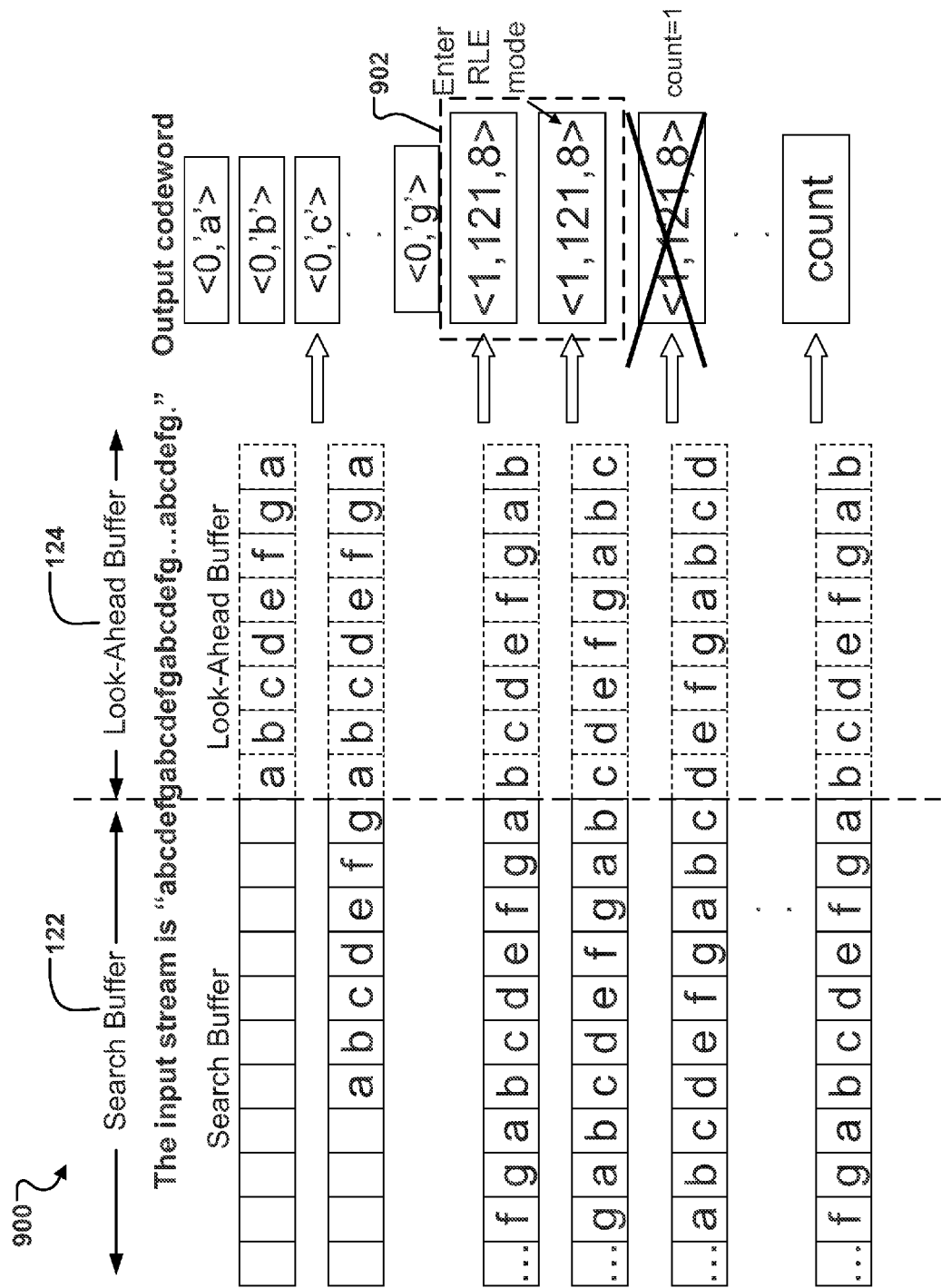
FIG. 9 is a block diagram showing an example encoding process that uses two identical codewords as an escape code.

FIG. 9 is a block diagram showing an example encoding process 900 that uses repeated occurrences of a codeword (e.g., two identical codewords) as an escape code. An encoder (e.g., encoder 410) compares the symbols in the look-ahead buffer 124 with the encoded symbols in the search buffer 122. Initially, the encoder operates to use the LZSS encoding mode unit 412 and encodes the symbols that do match the encoded symbols in the search buffer 122. When the encoder identifies a pattern of symbols in the look-ahead buffer 124 that matches the encoded symbols in the search buffer 122, the encoder outputs a codeword. In this encoding example 900, a codeword of <1, 121, 8> is used to represent one periodic pattern of 7 bytes (e.g., 'a,' 'b,' 'c,' 'd,' 'e,' 'f,' and 'g') in the look-ahead buffer 124. The encoder outputs the codeword <1, 121, 8> 902 twice consecutively before the encoder switches to use the RLE mode unit 414. Thus, the consecutive occurrence of two identical codewords 902 is used as a dynamic escape code.

The encoder operates the RLE mode unit 414 to count the number of times the pattern of symbols repeats in the look-ahead buffer 124 until the run of repeated pattern ends. The count begins with the first occurrence of the pattern of symbols after the escape code is outputted. When the pattern of symbols stops repeating, the encoder outputs the count and switches back to use the LZSS encoding mode unit 412. The encoder can include a counter to count the number of repeats.

Figure 10:
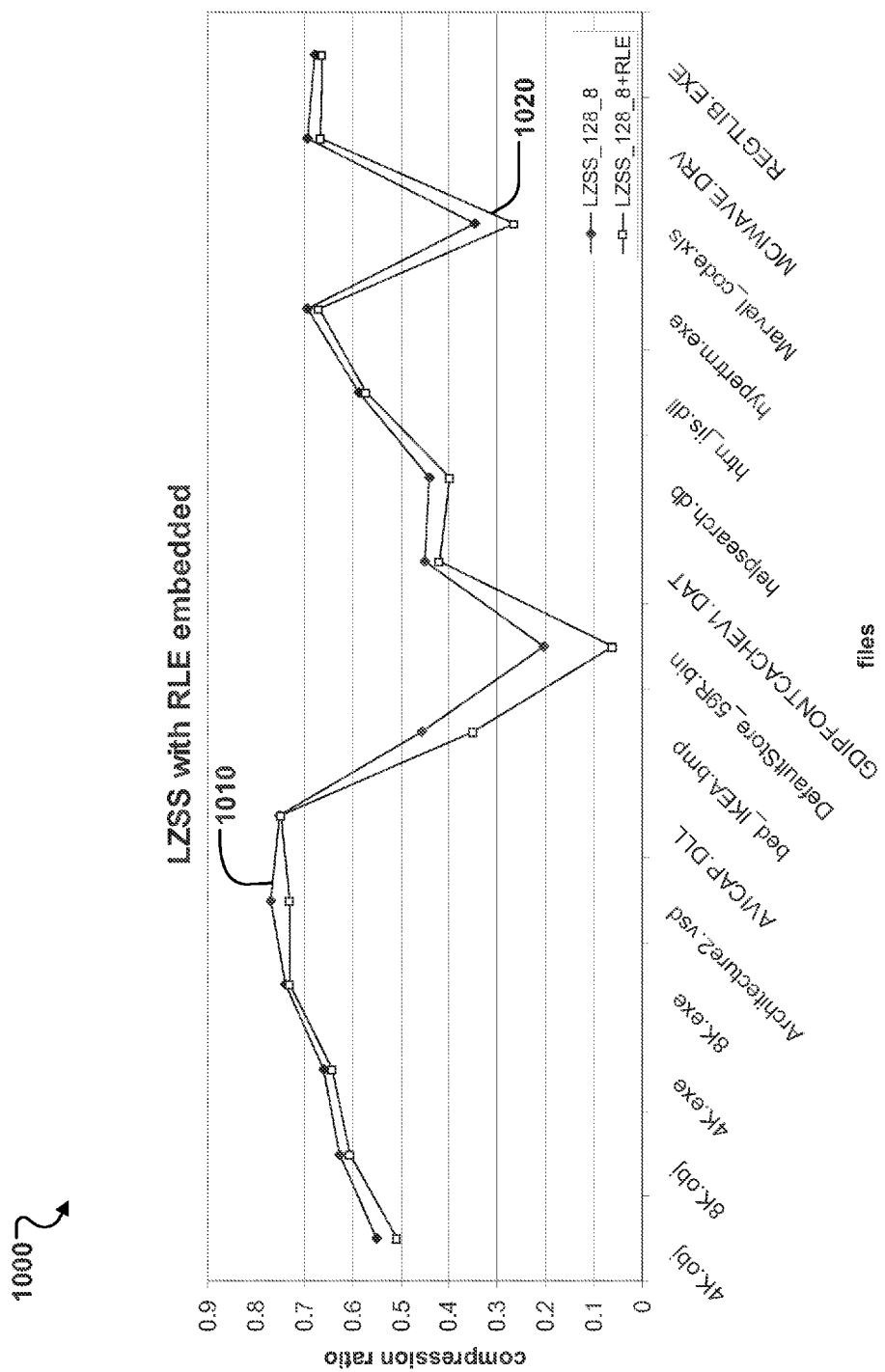
FIG. 10 is a graph that compares a compression performance of an LZSS encoder against an encoder that includes LZSS and RLE modes.

FIG. 10 is a graph 1000 that compares a compression performance of an LZSS encoder against an encoder that includes LZSS and RLE modes. The graph 1000 shows the compression ratio (y-axis) achieved for different data files (x-axis) when using an LZSS encoder (1010) and an encoder that includes an LZSS mode and an RLE mode (1020).

Figure 11:
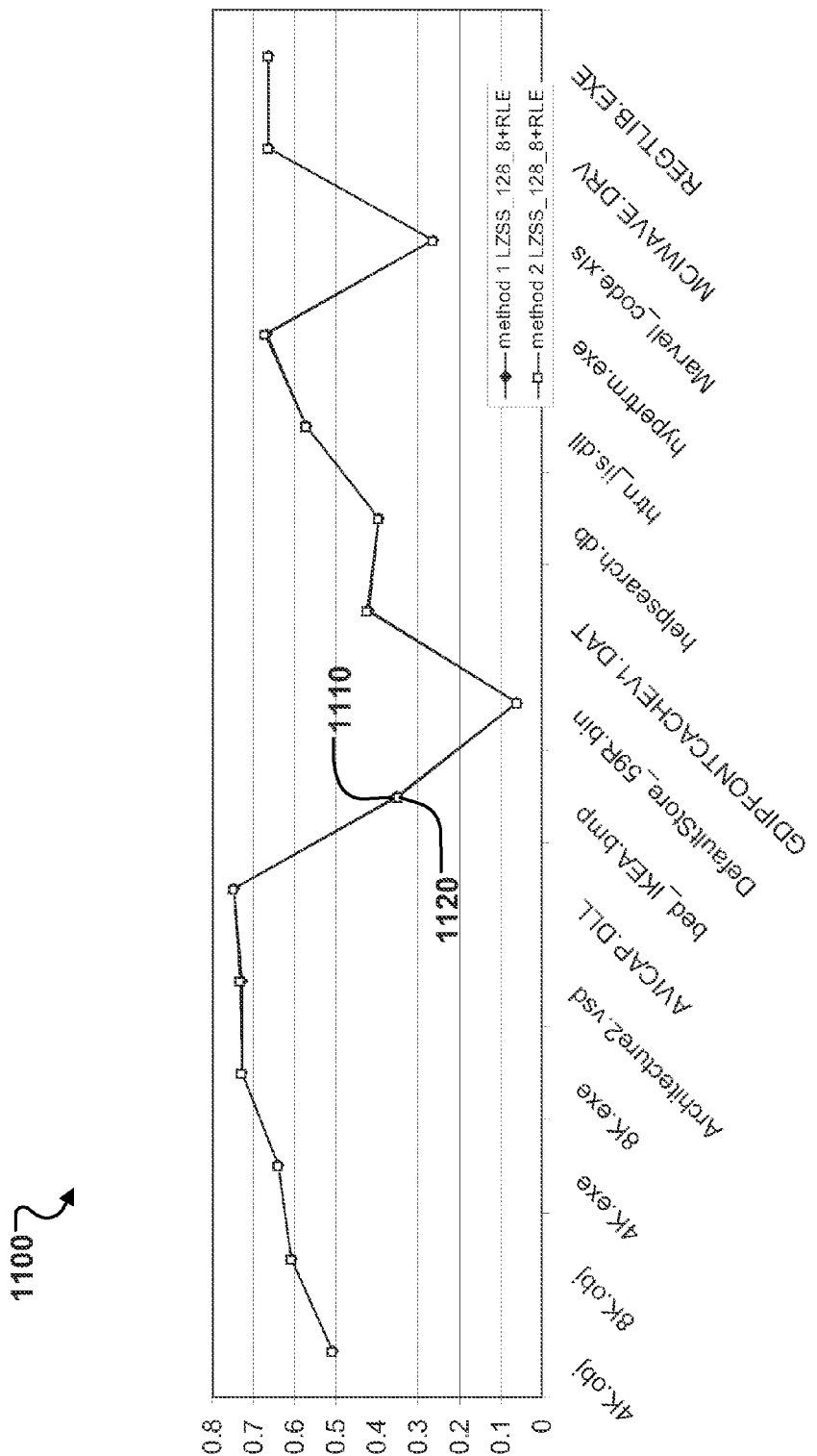
FIG. 11 is a graph that compares a compression performance of an encoder that uses two different escape code types.

FIG. 11 a graph 1100 that compares a compression performance of an encoder that uses two different escape code types. The graph 1100 shows the compression ratio (y-axis) achieved for different data files (x-axis) when using a codeword (1110) and two consecutive codewords (1120) as the escape code. The data shown in the graph 1100 demonstrate that there is no significant difference between a single codeword escape code and a two consecutive codewords escape code. Both escape code types have similar efficacy in improving data compression.

Figure 12A:
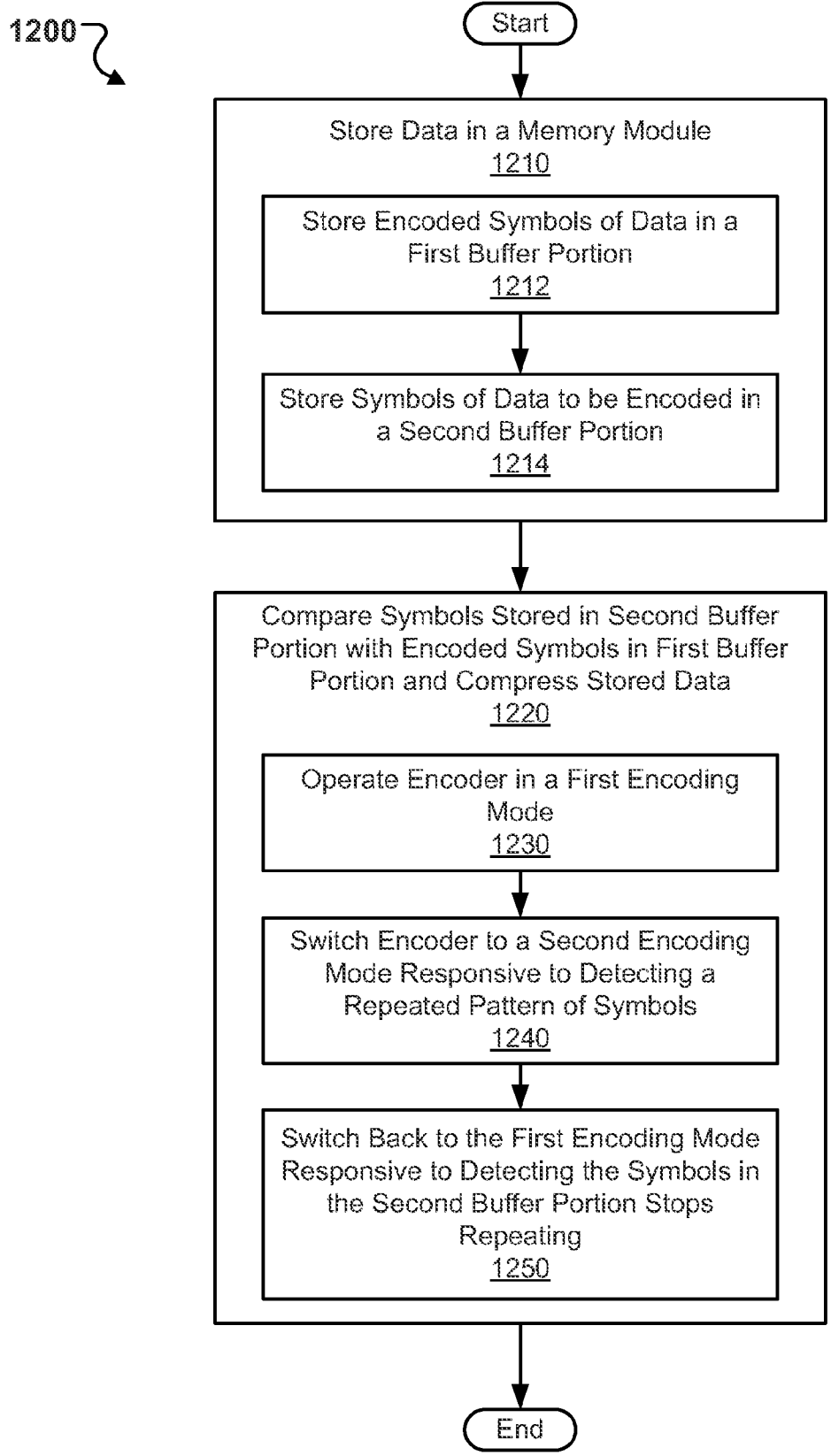
FIGS. 12A, 12B, 12C are process flow diagrams showing example processes for encoding symbols of a data file.
Figure 12B:
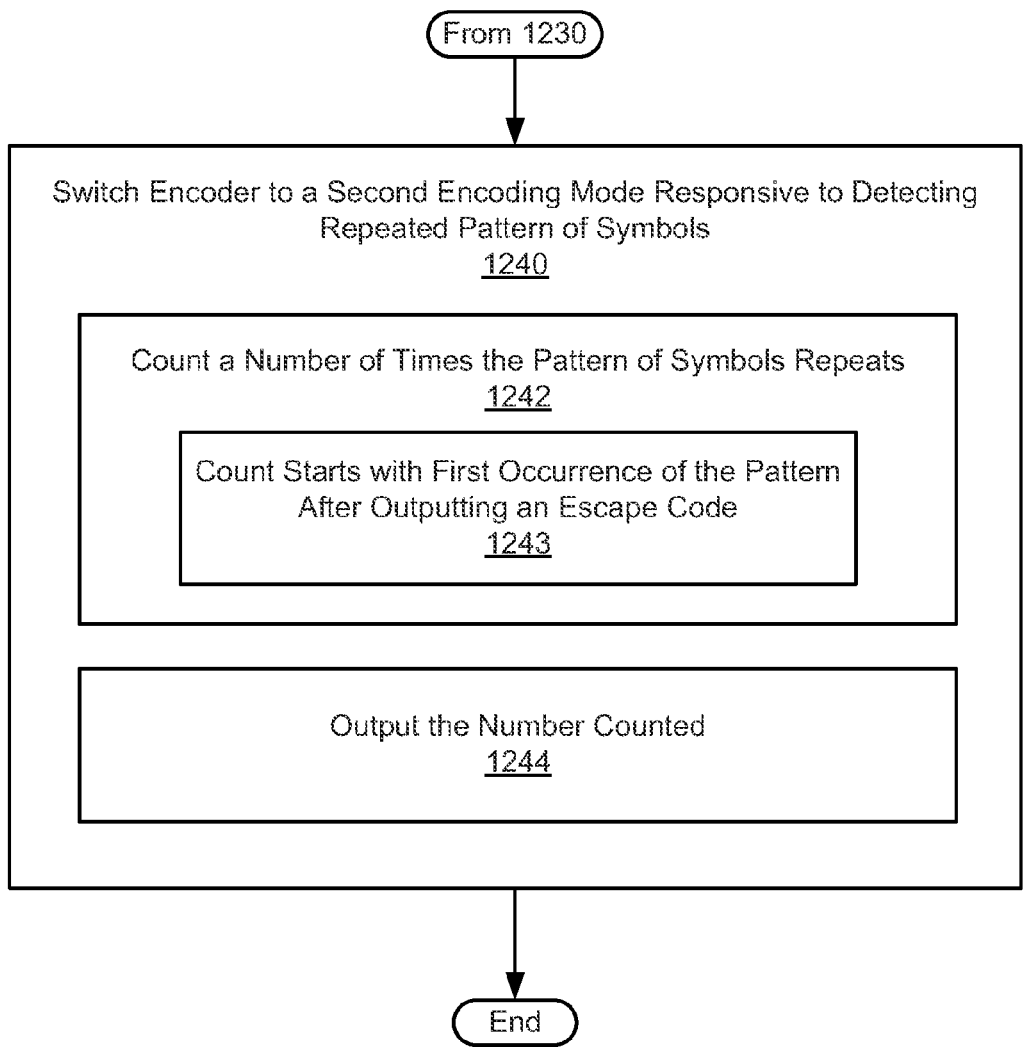
Figure 12C:
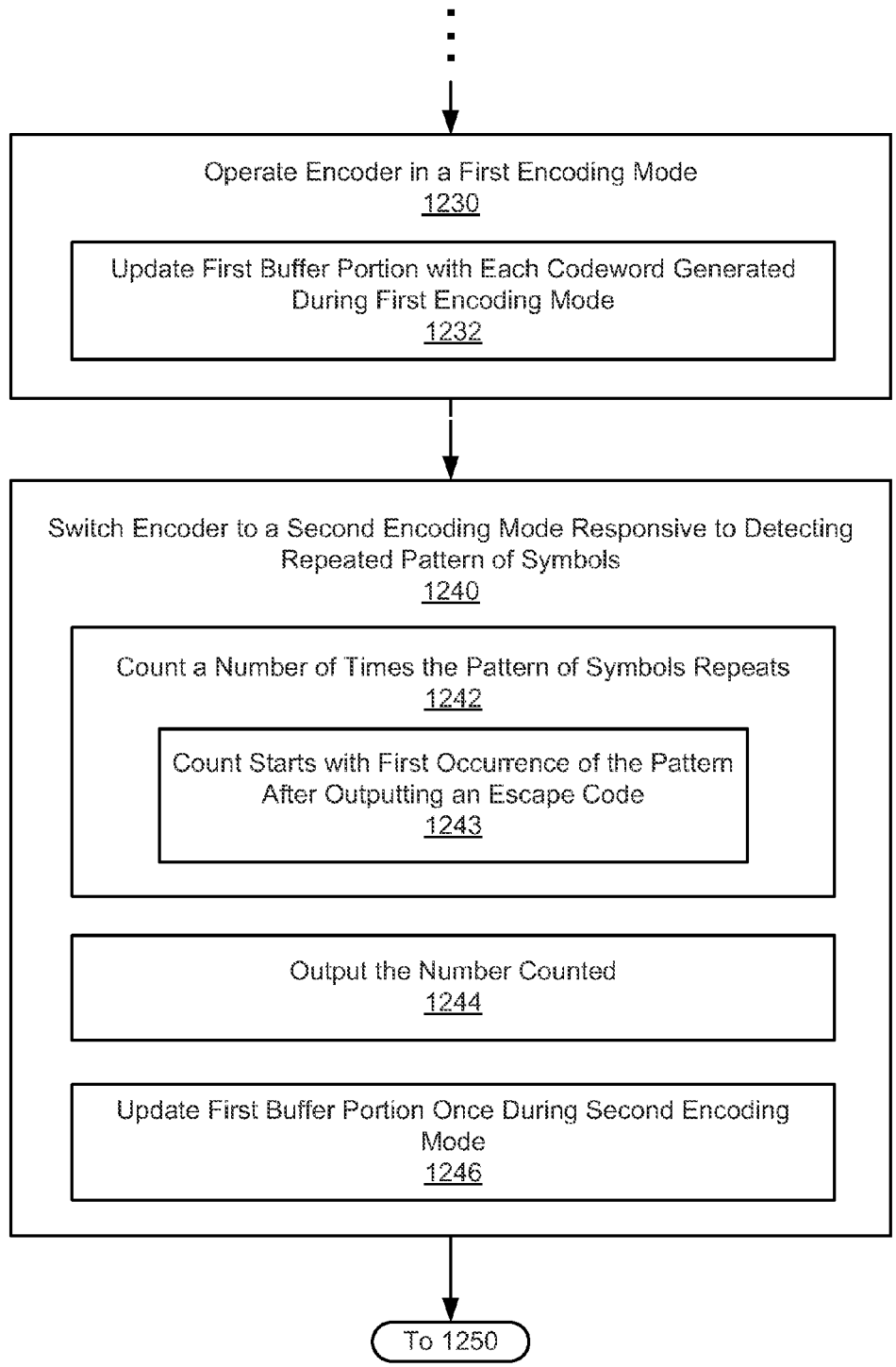

FIGS. 12A, 12B, 12C are process flow diagrams showing examples processes for encoding symbols of a data file. At 1210, a data processing device, such as a computer or a server, can store data in a memory module. For example, the data processing device can store an input stream of data in a local buffer. At 1212, the data processing device can store the data in the memory module by storing the encoded symbols of the data in a first buffer portion of the memory module. At 1214, the data processing device can store the data in the memory module by storing symbols of the data to be encoded in a second buffer portion of the memory module.

At 1220, an encoder (e.g., encoder 410) in the data processing device can compare the symbols stored in the second buffer portion with the encoded symbols stored in the first buffer portion and compress the stored symbols. At 1230, in comparing and compressing the data, the encoder can operate in a first encoding mode (e.g., by using a first encoding mode unit) to encode the symbols in the second buffer portion with corresponding codewords until detecting a repeated pattern of symbols in the second buffer portion that matches the encoded symbols in the first buffer portion. At 1240, responsive to detecting the repeated pattern of symbols, the encoder can switch to operate in a second encoding mode (e.g., by using a second encoding mode unit). At 1242, the encoder can count a number of times the pattern of symbols repeats in the second buffer portion during the second encoding mode. At 1244, the encoder can output the number counted during the second encoding mode. At 1243, the encoder can count the number of times the pattern of symbols repeats in the second buffer portion starting with a first occurrence of the pattern after outputting an escape code. At 1250, the encoder can switch back to the first encoding mode when detecting that the symbols in the second buffer portion stop repeating.

The first encoding mode can include a Lempel-Ziv encoding mode. The Lempel-Ziv encoding mode can include various types, such as a Lempel-Ziv-Storer-Szymanski (LZSS) encoding mode. The second encoding mode can include a run-length encoding (RLE) mode.

Additionally, the encoder can output an escape code responsive to the encoder detecting the repeated pattern of symbols. The escape code can include a single occurrence of a codeword. In some implementations, the escape code includes repeated occurrences of the codeword (e.g., two identical codewords).

The codeword can include a flag element and a literal element or an offset-length pair. A literal is the literal byte of a symbol or character. A flag indicates whether the next data in the escape code is a literal or an offset-length pair. An offset can represent the starting position of the pattern of symbols of the second buffer portion matched in the first buffer portion. Also, the offset can represent a size of the first buffer portion minus a length of the pattern of symbols that repeats in the second buffer portion. A length represents a size of the second buffer portion.

At 1232, the encoder can update the first buffer portion with each codeword generated during the first encoding mode. When operating in the second encoding mode, the encoder can delay updating the first buffer until the final count number is generated. Thus, at 1246, the encoder can update the first buffer portion just once during the second encoding mode.

Figure 13:
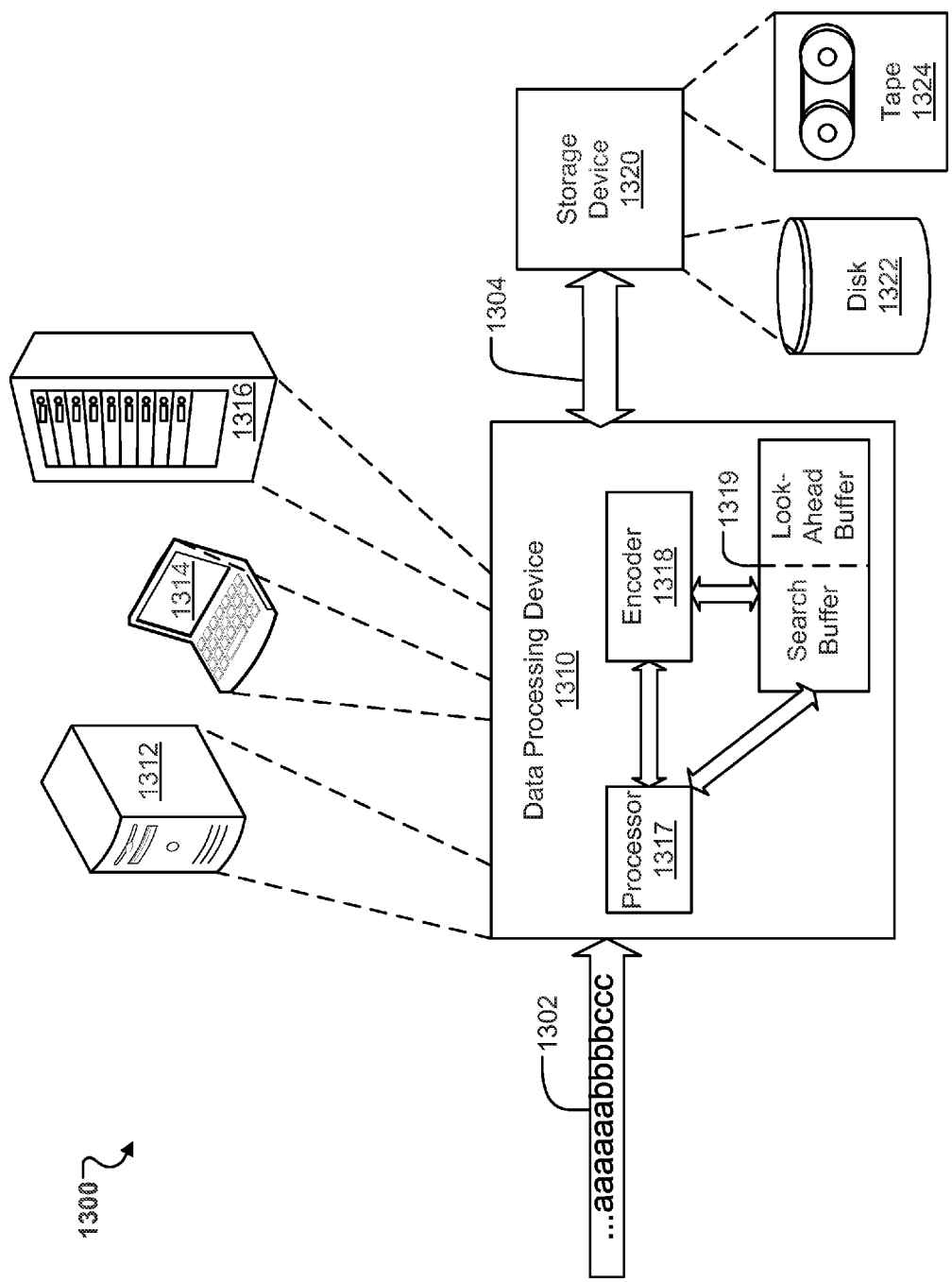
FIG. 13 is a block diagram of an example system for performing efficient lossless data compression.

FIG. 13 is a block diagram of an example system for performing efficient lossless data compression. The lossless data compression techniques and apparatus as described with respect to FIGS. 1-12C above can be implemented in various systems. For example, a networked system 1300 can implement the described lossless data compression techniques and apparatus to provide a networked storage system, such as a backup storage system. The system 1300 can include a data processing device 1310, such as a desktop computer 1312, a portable computing device 1314, an enterprise server 1316, etc. The data processing device 1310 can include a processor 1317, an encoder 1318 and a buffer 1319. The buffer 1319 can include a search buffer and a look-ahead buffer. The search buffer and the look-ahead buffer can be implemented as separate buffers or as separate portions of the same buffer. The encoder 1318 can be implemented to operate in a manner consistent with the encoder 410 described with respect to FIG. 4 above.

The data processing device 1310 can receive an input data stream 1302 and encode the received input data stream 1302 to generate compressed data 1304. The data processing device 1310 can communicate with a storage device 1320 to store the compressed data. The storage device 1320 can be included within the data processing device 1310 or be separate (as shown). Moreover, the storage device 1320 can include various types of storage devices, such as a disk storage device 1322, a tape storage device, etc. The storage device 1320 can include a primary storage device, a backup storage device, or both. The storage device 1320 can communicate with the data processing device 1310 over a network connection, such as the Internet, a local area network (LAN), wide area network, Ethernet, etc. In some implementations, the system 1300 can be implemented as a storage area network (SAN) to provide a storage system shared amongst various devices connected to the SAN.

The encoder 1318 can operate as dedicated compression hardware to offload the data compression functions from the processor 1317. By using the dedicated data compression hardware, the system can achieve faster and more efficient primary and backup data storage. Additionally, the processor 1317 can operate more efficiently because it is not burdened with the data compression operations.

The described lossless data compression techniques, apparatus and systems can be implemented in additional applications. For example, a dedicated data compression hardware can be used in a system to increase the throughput in a communication system. Compressed data tend to increase the speed of data communication, and a dedicated data compression hardware can help to alleviate issues related to transmitting and receiving large amounts of data.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An apparatus comprising:
a memory module to store data, wherein the memory module comprises
a first buffer portion to store encoded symbols of the data, and
a second buffer portion to store symbols of the data to be encoded; and
an encoder to compare the symbols stored in the second buffer portion with the encoded symbols stored in the first buffer portion and to compress the data, wherein the encoder is configured to
operate in a first encoding mode to encode the symbols in the second buffer portion with corresponding codewords until the encoder detects a repeated pattern of symbols in the second buffer portion that matches the encoded symbols in the first buffer portion, and
responsive to the encoder detecting the repeated pattern of symbols, switch to operate in a second encoding mode to
count a number of times the pattern of symbols repeats in the second buffer portion, and
output the number counted;
wherein the encoder is configured to switch back to the first encoding mode when the encoder detects that the symbols in the second buffer stop repeating.

2. The apparatus of claim 1, wherein the first encoding mode comprises a Lempel-Ziv encoding mode.

3. The apparatus of claim 2, wherein the Lempel-Ziv encoding mode comprises a Lempel-Ziv-Storer-Szymanski (LZSS) encoding mode; and
wherein the second encoding mode comprises a run-length encoding (RLE) mode.

4. The apparatus of claim 1, wherein the encoder is configured to output an escape code responsive to the encoder detecting the repeated pattern of symbols, the escape code comprising a single occurrence of a codeword, the escape code comprising:
- a flag to indicate whether next data in the escape code is a literal or an offset-length pair;
- an offset to represent a location of a match in the first buffer portion of the repeated pattern of symbols in the second buffer portion; and
- a length to represent a size of the second buffer portion.

5. The apparatus of claim 4, wherein the escape code comprises two consecutive occurrences of the codeword.

6. The apparatus of claim 4, wherein the encoder is configured to count the number of times the pattern of symbols repeats in the second buffer starting with a first occurrence of the pattern after outputting the escape code.

7. The apparatus of claim 1, wherein the encoder is configured to update the first buffer portion with codewords generated during the first encoding mode; and
wherein the encoder is configured to update the first buffer portion once during the second encoding mode.

8. A method performed by a data processing device, comprising:
- storing data in a memory module, the storing further comprising
  - storing encoded symbols of the data in a first buffer portion of the memory module, and
  - storing symbols of the data to be encoded in a second buffer portion of the memory module; and
- compressing the data, the compressing further comprising
  - comparing the symbols stored in the second buffer portion with the encoded symbols stored in the first buffer portion,
  - operating in a first encoding mode to encode the symbols in the second buffer portion with corresponding codewords until detecting a repeated pattern of symbols in the second buffer portion that matches the encoded symbols in the first buffer portion,
  - responsive to detecting the repeated pattern of symbols, operating in a second encoding mode, operating in the second encoding mode comprising
    - counting a number of times the pattern of symbols repeats in the second buffer portion, and
    - outputting the number counted, and
  - switching back to the first encoding mode when detecting that the symbols in the second buffer stop repeating.

9. The method of claim 8, wherein the first encoding mode comprises a Lempel-Ziv encoding mode.

10. The method of claim 9, wherein the Lempel-Ziv encoding mode comprises a Lempel-Ziv-Storer-Szymanski (LZSS) encoding mode; and
wherein the second encoding mode comprises a run-length encoding (RLE) mode.

11. The method of claim 8, further comprising outputting an escape code responsive to detecting the repeated pattern of symbols, the escape code comprising a single occurrence of a codeword, the escape code comprising:
- a flag to indicate whether next data in the escape code is a literal or an offset-length pair;
- an offset to represent a location of a match in the first buffer portion of the repeated pattern of symbols in the second buffer portion; and
- a length to represent a size of the second buffer portion.

12. The method of claim 11, wherein the escape code comprises two consecutive occurrences of the codeword.

13. The method of claim 11, further comprising counting the number of times the pattern of symbols repeats in the second buffer starting with a first occurrence of the pattern after outputting the escape code.

14. The method of claim 8, further comprising updating the first buffer portion with each codeword generated during the first encoding mode; and
updating the first buffer portion once during the second encoding mode.

15. A system comprising:
- a data processing device to encode data to generate compressed data, wherein the data processing device comprises:
  - a data buffer to receive input data, wherein the buffer comprises
    - a search buffer to buffer encoded symbols of the input data, and
    - a look-ahead buffer to buffer symbols of the input data to be encoded; and
  - an encoder to compare the symbols buffered in the look-ahead buffer with the encoded symbols buffered in the search buffer and to compress the input data, wherein the encoder is configured to
    - operate in a first encoding mode to encode the symbols in the look-ahead buffer with corresponding codewords until the encoder detects a repeated pattern of symbols in the look-ahead buffer that matches the encoded symbols in the search buffer, and
    - responsive to detecting the repeated pattern of symbols, switch to operate in a second encoding mode to
      - count a number of times the pattern of symbols repeats in the look-ahead buffer, and
      - output the number counted;
    - wherein the encoder is configured to switch back to the first encoding mode when the encoder detects that the symbols in the second buffer stop repeating.

16. The system of claim 15, wherein the first encoding mode comprises a Lempel-Ziv encoding mode.

17. The system of claim 16, wherein the Lempel-Ziv encoding mode comprises a Lempel-Ziv-Storer-Szymanski (LZSS) encoding mode; and
wherein the second encoding mode comprises a run-length encoding (RLE) mode.

18. The system of claim 15, wherein the encoder is configured to output an escape code responsive to the encoder detecting the repeated pattern of symbols, the escape code comprising a single occurrence of a codeword, the escape code comprising:
- a flag to indicate whether next data in the escape code is a literal or an offset-length pair;
- an offset to represent a location of a match in the search buffer of the repeated pattern of symbols in the look-ahead buffer; and
- a length to represent a size of the look-ahead buffer.

19. The system of claim 18, wherein the escape code comprises two consecutive occurrences of the codeword.

20. The system of claim 18, wherein the encoder is configured to
update the search buffer with each codeword generated during the first encoding mode;
update the search buffer once during the second encoding mode; and
count the number of times the pattern of symbols repeats in the second buffer starting with a first occurrence of the pattern after outputting the escape code.

* * * * *